United States Patent

Thibodeau

[15] 3,679,989

[45] July 25, 1972

[54] CLAMP CIRCUIT FOR PREVENTING SATURATION OF OPERATIONAL AMPLIFIER

[72] Inventor: Gregg Joseph Thibodeau, Dracut, Mass.

[73] Assignee: RCA Corporation

[22] Filed: Nov. 16, 1970

[21] Appl. No.: 89,573

[52] U.S. Cl. ................................330/185, 330/135, 330/75

[51] Int. Cl. ........................................H03f 1/00, H03f 3/00

[58] Field of Search ......................330/86, 69, 30 D, 32, 103, 330/185, 135, 136

[56] References Cited

UNITED STATES PATENTS

| | | | |
|---|---|---|---|
| 2,951,991 | 9/1960 | Rickher et al. | 330/32 |
| 3,447,095 | 5/1969 | McMillan | 330/69 X |

*Primary Examiner*—Nathan Kaufman

*Attorney*—H. Christoffersen

[57] ABSTRACT

An input clamping circuit for use with an operational amplifier to prevent saturation of the amplifier and to prevent excessive input signals thereto by limiting the differential input voltage applied to the amplifier.

5 Claims, 1 Drawing Figure

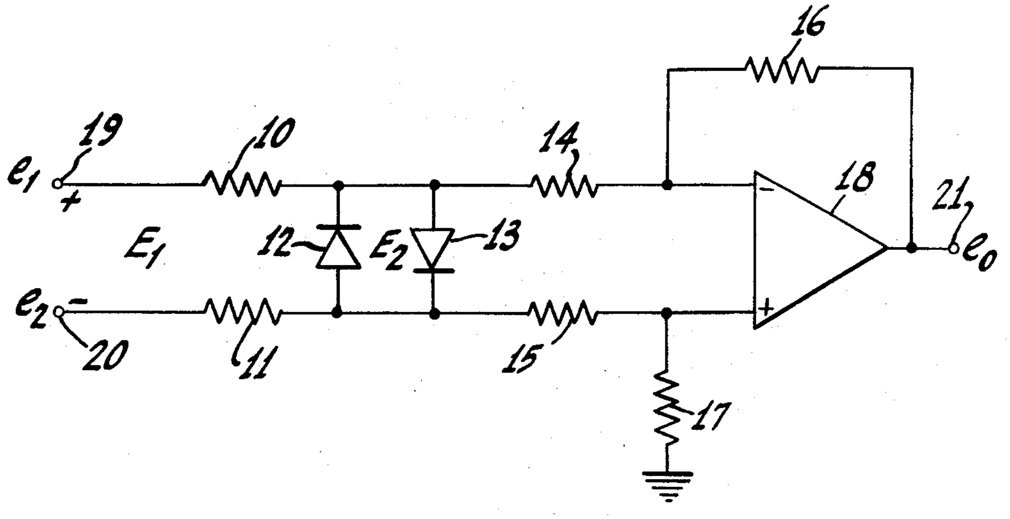
Inventor:
GREGG J. THIBODEAU
BY J. Donald Weber Jr.
Attorney

CLAMP CIRCUIT FOR PREVENTING SATURATION OF OPERATIONAL AMPLIFIER

The invention hereindescribed was made in the course of or under a contract with the Department of the Navy.

BACKGROUND OF THE INVENTION

There are several circuits known in the art for controlling operational amplifiers both in the operation thereof and the application of signals thereto. For example, there are many known applications of a pair of reverse poled diodes connected across the inputs of an operational amplifier to limit the input signal to prevent damage to the amplifier. In addition, it is known in the art to provide a zener diode feedback path around an operational amplifier in order to prevent the saturation thereof. However, the zener diode feedback path has the shortcoming that it is generally impractical in the case of a differential input operational amplifier. Moreover, in the previously known and described circuits, the purpose for utilizing reverse poled input diodes is merely to protect the amplifier; but the diodes do not prevent saturation of the operational amplifier.

SUMMARY OF THE INVENTION

The preferred embodiment of the instant invention includes a pair of reverse poled diodes (which may be diode-connected transistors) connected between the differential inputs of an operational amplifier. Resistors are connected on either side of the diodes. That is, one pair of resistors is connected between the input terminals and the diode network while another pair of resistors is connected between the diode and network and the input terminal of the operational amplifier. Thus, the diodes may be considered as connected to terminals of a resistance voltage divider. A feedback resistor and an input load resistor are provided at the operational amplifier. A preferred relationship is established between the individual resistors of each pair of resistors where the feedback and input load resistors are considered a resistor pair. With this configuration, the output of the operational amplifier is prevented from saturating. As a secondary benefit, the diode network, of course, provides protection whereby the inputs are not destroyed.

BRIEF DESCRIPTION OF THE DRAWINGS

The single FIGURE shows a schematic diagram of a preferred embodiment of the invention.

DESCRIPTION OF THE PREFERRED EMBODIMENT

Referring now to the schematic diagram, the plus (+) input terminal 19 is connected to the inverting input of amplifier 18 via the series combination of resistors 10 and 14. An input signal $e_1$ is supplied to terminal 19. The minus (−) input terminal 20 is connected to the noninverting input of amplifier 18 via series connected resistors 11 and 15. An input signal $e_2$ is supplied to terminal 20. A pair of diodes 12 and 13 are connected from the common junction of resistors 10 and 14 to the common junction of resistors 11 and 15. Diode 12 has the cathode connected to the junction between resistors 10 and 14 along with the anode of diode 13. The cathode of diode 13, along with the anode of diode 12, is connected to the common junction of resistors 11 and 15. The noninverting input of amplifier 18 is connected to ground via resistor 17. The output of amplifier 18 is returned to the inverting input thereof via feedback resistor 16. Output terminal 21 is connected, to the output of amplifier 18 and output signal $e_0$ is produced at this terminal.

In actual construction, diodes 12 and 13 may be diode-connected transistors, i.e. transistors, which have the base and collector electrodes connected together. In addition, the feedback path may include a stability compensating capacitor connected in parallel with resistor 16, if desired.

In general, the basic relationships which are desirable, but not essential, are that the resistances of resistors 10 and 11 would be substantially equal as would be the resistances of resistors 14 and 15 and resistances of resistors 16 and 17. In a typical application, resistors 10 and 11 may be on the order of 650 ohms, resistors 14 and 15 may be on the order of 5,000 ohms and resistors 16 and 17 may be on the order of 62,000 ohms. In addition, the operating characteristics of diodes 12 and 13 would be reasonably closely matched. As noted, these relationships are desirable but not essential. That is, by utilizing the relationships a balanced operation of the network will obtain whereby equal control of both sides of the differential input to the differential amplifier would be effected. Moreover, the diode connected transistor configuration will usually provide a sharper operating characteristic than a simple diode. However, a simple diode will be satisfactory in most applications.

Generally, the operation of the circuit is straight-forward. That is, the differential voltage E1 i.e. el - *e*a) applied to the operational amplifier is limited by conduction of diodes 12 and 13. That is, for low level input voltages, the diodes conduct a negligible amount of current and the circuit operates as a simple differential amplifier. If, on the other hand, the differential input voltage becomes excessive, one of the diodes conducts, depending upon the polarity of the differential input signal. With the conduction of one of the diodes, the differential voltage supplied to the operational amplifier is limited. Limitation of the input voltage supplied to the operational amplifier, in turn, limits the output voltage and prevents saturation of the amplifier. Thus, this clamp circuit clamps a differential input voltage which is not possible with the standard, known circuitry which uses a zener diode in the feedback network.

In considering the operation of the amplifier of the circuit, it is useful to examine the mathematical relationships in the circuit. For example, the output voltage *e*0 is to be prevented from achieving a saturation level which is designated as | e0 | max. Since the mathematical equivalent of the circuit may be defined as follows:

$$\frac{e_0}{e_1 - e_2} = \frac{e_0}{E_1} = \frac{R_{16}}{R_{10} + R_{14}}$$

it follows that, in order to prevent saturation of the amplifier the equation $$\frac{R_{16}}{R_{14}} \mid E_2 \mid \max \leq \mid e_0 \mid \max$$

is utilized. In the equations set out, the e signals are referenced at the Figure while the R designations refer to the resistance values of resistors in the subnumeral.

Furthermore, it may be shown that the output error voltage ($\Delta e0$) in the active region of the amplifier operation and due to a diode leakage current is given by the equation $$\Delta e0 = (I_{D|E2})\ (R_{10} + R_{11}) \left( \frac{R_{14}}{R_{10} + R_{14}} \right)$$

The function $$I_{D\,|\,E2}$$

is defined as the total current through the clamp diodes 12 and 13 for a voltage across the diodes equal to $E2$. Furthermore $E2$ is given by the equation $E2 = R14/R10\ E_1$. By utilizing this information and the diode operating characteristics, the limit may be set on the useful, accurate, maximum output voltage.

For improved operation, a diode with a very sharp forward characteristic (i.e. low forward resistance) is required. A diode-connected transistor will usually provide a sharper characteristic than a simple diode and, therefore, is preferable.

In addition to preventing saturation of the amplifier output, the instant circuit does not cause instability of the amplifier when activated. Moreover, this circuit utilizes the forward characteristic of a diode which is inherently less noisy than the reverse breakdown characteristic of a zener diode. Additionally, the circuit requires a relatively small number of components and is relatively inexpensive to manufacture. Furthermore, the instant circuit is a circuit wherein the amplifier compensation can be optimized for stability in the active region so that high speed operation can be obtained without over compensating to insure stability as is required in other known circuits.

Thus, there is described a novel clamp circuit for use with a differential operational amplifier. This circuit provides advantageous operation of a differential operational amplifier. As suggested supra, certain changes may be made to the circuit which changes are intended to be included within the purview of the invention as described in the claims appended hereto.

What is claimed is:

1. In combination, amplifier means having first and second input terminals and an output terminal, input means, first and second impedance means connected in series between said input means and said first input terminal of said amplifier means, third and fourth impedance means connected in series between said input means and said second input terminal of said amplifier means, feedback circuit means connected between said output terminal and said first input terminal of said amplifier means, and unidirectional conducting means comprising a pair of back-to-back diodes connected in parallel between the common junction of said first and second impedance means and the common junction of said third and fourth impedance means to control the signal level at said common junctions.

2. The combination recited in claim 1 wherein said amplifier means comprises a differential operational amplifier.

3. The combination recited in claim 1 wherein said first and third impedances are substantially identical, and said second and fourth impedances are substantially identical.

4. The combination recited in claim 1 including fifth impedance means connected from said second input terminal of said amplifier means to potential source means, said fifth impedance means and said feedback circuit means being substantially identical in impedance value.

5. The combination recited in claim 1 wherein said feedback circuit means comprises resistance means.

* * * * *